United States Patent [19]

Seki et al.

[11] Patent Number: 4,768,072
[45] Date of Patent: Aug. 30, 1988

[54] MULTILAYER SEMICONDUCTOR DEVICE HAVING AN AMORPHOUS CARBON AND SILICON LAYER

[75] Inventors: Yasakazu Seki, Tokyo; Noritada Sato, Yokosuka; Masaya Yabe, Kanagawa, all of Japan

[73] Assignees: Fuji Electric Corporate Research and Development Co., Ltd.; Fuji Electric Co. Ltd., both of Japan

[21] Appl. No.: 914,501

[22] Filed: Oct. 2, 1986

Related U.S. Application Data

[63] Continuation of Ser. No. 661,676, Oct. 17, 1984, abandoned.

[30] Foreign Application Priority Data

Jan. 20, 1984 [JP] Japan .................................. 59-8800

[51] Int. Cl.$^4$ ............................................ H01L 27/14
[52] U.S. Cl. ........................................ 357/29; 357/2; 357/30; 357/59
[58] Field of Search ................ 357/29, 2, 30 K, 59 R, 357/59 A, 59 B, 59 G

[56] References Cited

U.S. PATENT DOCUMENTS

| | | | |
|---|---|---|---|
| 4,342,044 | 7/1982 | Ovshinsky et al. | 357/2 |
| 4,524,237 | 6/1985 | Ross et al. | 357/30 |
| 4,555,464 | 11/1985 | Kido et al. | 357/2 |

FOREIGN PATENT DOCUMENTS

| | | | |
|---|---|---|---|
| 0115551 | 7/1982 | Japan | 430/67 |
| 0163956 | 9/1983 | Japan | 357/2 |

OTHER PUBLICATIONS

Norde, H. et al., *Behavior of amorphous Ge contacts to monocrystalline silicon*, Pergamon Press, vol. 27, No. 3, pp. 201–208, (1977).

*Primary Examiner*—James W. Davie
*Attorney, Agent, or Firm*—Brumbaugh, Graves, Donohue & Raymond

[57] ABSTRACT

In the typical embodiments of the invention described in the specification, a radiation detector has a single crystal silicon substrate coated with an amorphous semiconductor film containing silicon and carbon, metal electrodes being provided. Amorphous layers are formed by a plasma CVD method using mixtures of monosilane gas and acetylene or tetrafluorocarbon gas at a pressure of 10 Torr with an applied voltage of 400–800 volts providing increased band gaps and higher resistivity to reduce current leakage.

2 Claims, 1 Drawing Sheet

MULTILAYER SEMICONDUCTOR DEVICE HAVING AN AMORPHOUS CARBON AND SILICON LAYER

This application is a continuation of application Ser. No. 661,676, filed on Oct. 17, 1984, abandoned.

BACKGROUND OF THE INVENTION

This invention relates to semiconductor radiation detectors and, more particularly, to a new and improved semiconductor radiation detector.

As one type semiconductor radiation detector, our copending U.S. patent application Ser. No. 613,890 filed May 24, 1984 U.S. Pat. No. 4,692,782, proposed a detector which comprises a silicon crystal substrate, a hydrogenated undoped amorphous silicon film deposited on the substrate, and metal electrodes provided on the substrate and the amorphous silicon film. When a reverse bias voltage is applied between the electrodes, a high energy barrier is produced at the heterojunction to enlarge the depletion layer. More radiation arriving at the depletion layer is therefore captured and then detected.

The resistivity of hydrogenated undoped amorphous silicon is high, i.e., on the order of $10^{11}$ to $10^{12}$ $\Omega$-cm. In addition, since the mobility band gap is inherent in the hydrogenated undoped amorphous silicon, the magnitude of the energy barrier at the heterojunction between the single crystal silicon and the hydrogenated undoped amorphous silicon is substantially fixed.

As a result, there is a limit in the reduction of a reverse leakage current which can be accomplished by that arrangement. Therefore, the depletion layer is not enlarged to a very great extent with the result that the most satisfactory radiation detecting efficiency is not obtained.

Accordingly, it is an object of the present invention to provide a semiconductor radiation detector having reduced reverse leakage current and improved radiation detecting efficiency.

SUMMARY OF THE INVENTIONS

In accordance with the present invention, a semiconductor radiation detector has an amorphous layer of silicon and carbon deposited on a single crystal silicon substrate. This provides a substantially larger energy barrier at the heterojunction to reduce the reverse leakage current of the detector.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
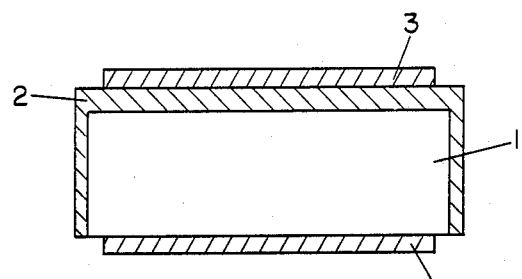
FIG. 1 is a schematic sectional view showing a conventional semiconductor radiation detector.

FIG. 1 illustrates a conventional radiation detector consisting of a single crystal of silicon 1, an amorphous silicon film 2, and metal electrodes 3 and 4 affixed to opposite surfaces.

EXAMPLE 1

Using a monosilane gas and a methane gas, an amorphous silicon carbide film ($Si_xC_{1-x}$: H) is deposited on one surface of a P-type high resistivity single crystal silicon substrate by means of a plasma CVD method of DC glow discharge.

Figure 2:
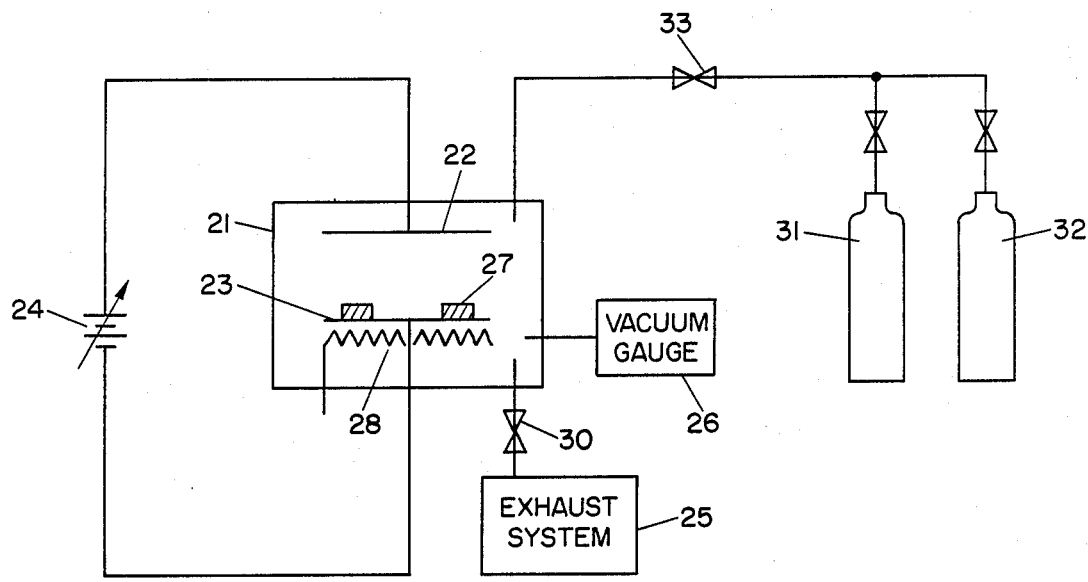
FIG. 2 is a schematic sectional view illustrating an apparatus for producing a radiation detector according to the present invention.

FIG. 2 is a schematic view showing a typical apparatus for producing the amorphous silicon carbide film. The apparatus includes a reaction chamber 21, two discharge electrodes 22 and 23, a DC power supply 24, an exhaust system 25, and a vacuum gauge 26. Silicon crystals 27 are positioned on the electrode 23 and a heater 28 is provided for heating that electrode. An exhaust adjusting valve 30, a monosilane gas bomb 31, a methane gas bomb 32, and an adjusting valve 33 for adjusting the gas flow rate are also provided.

Using the apparatus shown in FIG. 2, an amorphous silicon carbide film was produced on a surface of a silicon single crystal by means of a plasma CVD method under the following conditions:

1. Silicon single crystal: resistivity 10K$\Omega$ cm, P-type
2. Substrate temperature: 200° C.
3. Gases used:
   (1) monosilane (10% hydrogen dilution)
   (2) methane (10% hydrogen dilution)
4. Gas pressure: 10.0 Torr
5. Applied voltage: DC 400 to 800 V In this case, the relation between the monosilane and methane gas flow rates is given by the following formula:

$$CH_4/(SiH_4 + CH_4) = 0.7$$

The amorphous silicon carbide film thus produced has a mobility band gap of 1.95 eV. It was determined by X-ray photoelectron spectroscopy (ESCA) measurements that the carbon content is 24%.

With an amorphous silicon carbide film produced under the conditions described above, the mobility band gap is larger than that obtained with an undoped amorphous silicon film used for conventional detectors, and a higher resistivity is provided. In such a detector having a heterojunction formed by single crystal silicon and a layer of amorphous silicon carbide, the reverse leakage current is decreased by more than 10% as compared with that of conventional detectors. As a result, the radiation detecting efficiency is increased by more than 15% as compared with that of a conventional detector.

Figure 3:
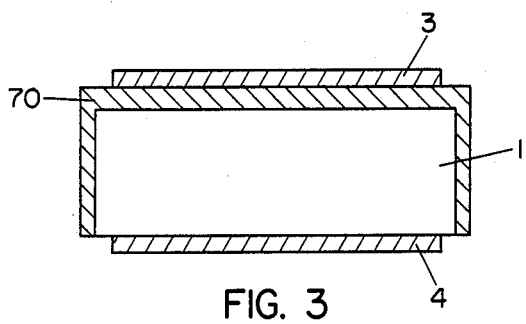
FIGS. 3, 4 and 5 are schematic sectional views showing different embodiments of radiation detectors according to the present invention.

A sectional view of the semiconductor radiation detector prepared according to this example is shown in FIG. 3. As the metal electrodes 3 and 4, aluminum and gold are deposited on an amorphous silicon carbide film 70 and a silicon single crystal substrate 1, respectively, using a vacuum deposition method. In this embodiment the crystal 1 is a P-type silicon single crystal.

EXAMPLE 2

Using a monosilane gas and an acetylene gas, an amorphous silicon carbide film ($Si_xC_{1-x}$: H) is deposited on P-type silicon single crystal substrate by means of a plasma CVD method of DC glow discharge.

The fabricating apparatus is similar to that shown in FIG. 2 but an acetylene gas bomb is used instead of the methane gas bomb 32. Using that apparatus, an amorphous silicon carbide film was deposited on a surface of single crystal silicon substrate by the plasma CVD method under the following conditions:
1. Silicon single crystal: resistivity 10KΩ cm, P-type
2. Substrate temperature: 200° C.
3. Gases used:
   (1) monosilane (10% hydrogen dilution)
   (2) acetylene (10% hydrogen dilution)
4. Gas pressure: 10.0 Torr
5. Applied voltage: DC 400 to 800 V In this case, the relation between the monosilane and acetylene gas flow rates is given by the following formula:

$$C_2H_2/(SiH_4+C_2H_2)=0.18$$

The amorphous silicon carbide film thus produced has a mobility band gap of 1.95 eV. It was determined by X-ray photoelectron spectroscopy (ESCA) measurement that the carbon content is 16%.

With an amorphous silicon carbide film as produced under the conditions described above, the mobility band gap is enlarged as compared with that obtained with an undoped amorphous silicon film used for conventional detectors and higher resistivity is provided. In such a detector, having a heterojunction formed by single crystal silicon and a layer of amorphous silicon carbide, the reverse leakage current is decreased by more than 10% as compared with that of a conventional detector. As a result, it was found that the radiation detecting efficiency is increased by more than 15% as compared with that of a conventional detector.

Figure 4:
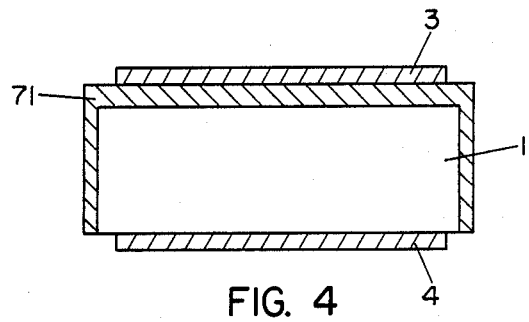

A sectional view of the semiconductor radiation detector made according to this example is shown in FIG. 4. This detector has a P-type silicon single crystal 1, an amorphous silicon carbide film 71 and metal electrodes 3 and 4.

EXAMPLE 3

Using a mixture of a monosilane gas and a tetrafluorocarbon gas (CF$_4$), an amorphous silicon-carbon film is deposited on a P-type silicon single crystal substrate by means of a plasma CVD method of DC glow discharge.

The fabricating apparatus is similar to that shown in FIG. 2 but a CF$_4$ gas bomb is used in place of the methane gas bomb 32. Utilizing that apparatus, the amorphous silicon-carbon film was deposited on the surface of the single crystal silicon substrate by the plasma CVD method under the following conditions:
1. Silicon single crystal: resistivity 10KΩ cm, P-type
2. Substrate temperature: 200° C.
3. Gases used:
   (1) monosilane (10% hydrogen dilution)
   (2) tetrafluorocarbon (CF$_4$)
4. Gas pressure: 10.0 Torr
5. Applied voltage: DC 400 to 800 V In this case, the relation between the monosilane and tetrafluorocarbon gas flow rates is given by the following formula:

$$CF_4/(SiH_4+CH_4)=0.5$$

In the amorphous silicon-carbon film thus prepared, the composition ratio of carbon, silicon, fluorine, and the like, and the film structure, has not yet been determined, but uniform amorphous films with high resistivity can be provided under conditions described above.

In radiation detectors produced by the method, the reverse leakage current is reduced by more than 10% as compared with that of conventional detectors. As a result, it was found that the radiation detecting efficiency is increased by more than 15% as compared with that of a conventional detector.

Figure 5:
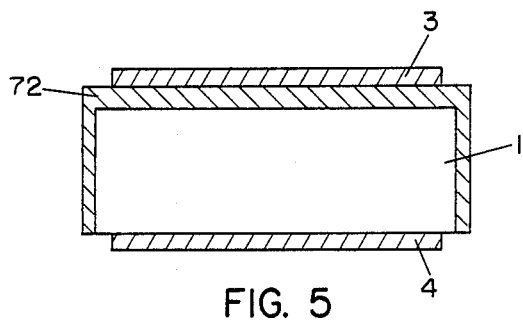

The structure of a semiconductor radiation detector according to this example, shown in FIG. 5, includes a P-type silicon single crystal 1, an amorphous silicon-carbon film 72, and metal electrodes 3 and 4.

According to the present invention as described above, by using a film composed of a compound or mixture of silicon and carbon as an amorphous semiconductor film deposited on the surface of single crystal semiconductor substrate, the resistivity of the film is increased, and the energy barrier of the heterojunction between the film and the substrate is enlarged, so that semiconductor radiation detectors having low reverse leakage current and high radiation detecting efficiency can be provided.

We claim:
1. A device comprising:
   (a) a single crystal silicon substrate of a first conductivity type;
   (b) an amorphous layer comprising carbon and silicon contiguous with at least one major surface of the substrate, wherein the composition of the amorphous layer is such that said amorphous layer has a larger mobility band gap and a higher resistivity than an undoped amorphous silicon film;
   (c) a first electrode overlying the amorphous layer; and
   (d) a second electrode contiguous with the major surface of the substrate opposite said amorphous layer and making electrical contact with the substrate.
2. The device according to claim 1, wherein the amorphous layer contains form 16% to 24% carbon.

* * * * *